(12) United States Patent
Solbeck et al.

(10) Patent No.: US 12,323,119 B2
(45) Date of Patent: Jun. 3, 2025

(54) HEADSET COMMUNICATION SYSTEM

(71) Applicant: Gentex Corporation, Simpson, PA (US)

(72) Inventors: Jason A. Solbeck, Atkinson, NH (US); Jacob Chaloux, Derry, NH (US)

(73) Assignee: Gentex Corporation, Simpson, PA (US)

( * ) Notice: Subject to any disclaimer, the term of this patent is extended or adjusted under 35 U.S.C. 154(b) by 497 days.

(21) Appl. No.: 17/053,623

(22) PCT Filed: May 17, 2019

(86) PCT No.: PCT/US2019/032900
§ 371 (c)(1),
(2) Date: Nov. 6, 2020

(87) PCT Pub. No.: WO2019/222648
PCT Pub. Date: Nov. 21, 2019

(65) Prior Publication Data
US 2021/0226599 A1    Jul. 22, 2021

Related U.S. Application Data

(60) Provisional application No. 62/673,836, filed on May 18, 2018, provisional application No. 62/673,599, filed on May 18, 2018.

(51) Int. Cl.
*H03G 3/34* (2006.01)
*H03F 1/52* (2006.01)
*H04R 1/10* (2006.01)

(52) U.S. Cl.
CPC .............. *H03G 3/342* (2013.01); *H03F 1/52* (2013.01); *H04R 1/1041* (2013.01); *H03F 2200/03* (2013.01); *H04R 2420/07* (2013.01)

(58) Field of Classification Search
CPC ....... H03G 3/342; H03F 1/52; H03F 2200/03; H04R 1/1041; H04R 2420/07
See application file for complete search history.

(56) References Cited

U.S. PATENT DOCUMENTS 3,965,419 A * 6/1976 Paiva .................... G01R 19/04
324/121 R
5,521,635 A * 5/1996 Mitsuhashi ............ H04R 3/005
386/E5.072

(Continued)

FOREIGN PATENT DOCUMENTS

DE    112015006654    3/2018
JP    2017-028351 A    2/2017

(Continued)

OTHER PUBLICATIONS

Supplementary European Search Report for EP 19 80 2936 dated Jan. 24, 2022, 4 pages.

(Continued)

*Primary Examiner* — Junpeng Chen
(74) *Attorney, Agent, or Firm* — Morgan, Lewis & Bockius LLP

(57) ABSTRACT

A headset communication system with improved functionality. The headset communication system may include hear-through limiter functionality. The headset communication system may include failsafe functionality. The headset communication system may include multichannel, mixing, passive push-to-talk functionality. The headset communication system may include near field magnetic induction functionality.

14 Claims, 15 Drawing Sheets

(56) References Cited

U.S. PATENT DOCUMENTS

| | | | | |
|---|---|---|---|---|
| 5,978,490 | A | * | 11/1999 | Choi ................. H04R 3/005 381/92 |
| 9,661,438 | B1 | | 5/2017 | Yang et al. |
| 2002/0126855 | A1 | * | 9/2002 | Terada ............... H04M 9/082 379/406.01 |
| 2013/0163775 | A1 | * | 6/2013 | Yamkovoy ....... G10K 11/17873 381/71.6 |
| 2014/0079249 | A1 | | 3/2014 | Chen et al. |
| 2014/0126733 | A1 | | 5/2014 | Gauger et al. |
| 2015/0045095 | A1 | * | 2/2015 | D'Souza ............. H03F 3/187 330/297 |
| 2015/0117833 | A1 | * | 4/2015 | Chen .................. H04N 5/772 386/227 |
| 2016/0005417 | A1 | * | 1/2016 | Van Hoesel .......... H04R 3/005 381/317 |
| 2017/0053636 | A1 | * | 2/2017 | Oswald ............ G10K 11/17873 |

FOREIGN PATENT DOCUMENTS

| | | |
|---|---|---|
| JP | 2017-028352 | 2/2017 |
| WO | 2015035492 A1 | 3/2015 |
| WO | 2018063917 A2 | 4/2018 |

OTHER PUBLICATIONS

Written Opinion and International Search Report for PCT/US19/32900; dated Sep. 10, 2019; 12 pages.
Notice of First Refusal Ruling for corresponding Korean Patent Application No. 10-2020-7035044 dated Mar. 31, 2023, 13 pages.
Notification of Provisional Rejection dated Aug. 25, 2022, for Korean Patent Application No. 10-2020-7035044 (9 pages).

* cited by examiner

HEADSET COMMUNICATION SYSTEM

CROSS-REFERENCE TO RELATED APPLICATIONS

This application is a U.S. National Phase of International Application No. PCT/US2019/032900, filed May 17, 2019, which claims the benefit of U.S. Provisional Application No. 62/673,836, filed May 18, 2018 entitled "Headset Communication System" and U.S. Provisional Application No. 62/673,599, filed May 18, 2018 entitled "Communication Headset", each of which is incorporated by reference herein in its entirety.

FIELD OF THE INVENTION

The present invention generally relates to a headset communication system and, more particularly, to systems, methods and apparatuses for improved headset communications with external sources.

BRIEF DESCRIPTION OF THE SEVERAL VIEWS OF THE DRAWINGS

The following detailed description of embodiments of the communication headset will be better understood when read in conjunction with the appended drawings of an exemplary embodiment. It should be understood, however, that the invention is not limited to the precise arrangements and instrumentalities shown.

In the drawings.

DETAILED DESCRIPTION OF THE EXEMPLARY EMBODIMENTS OF THE INVENTION

Figure 1:
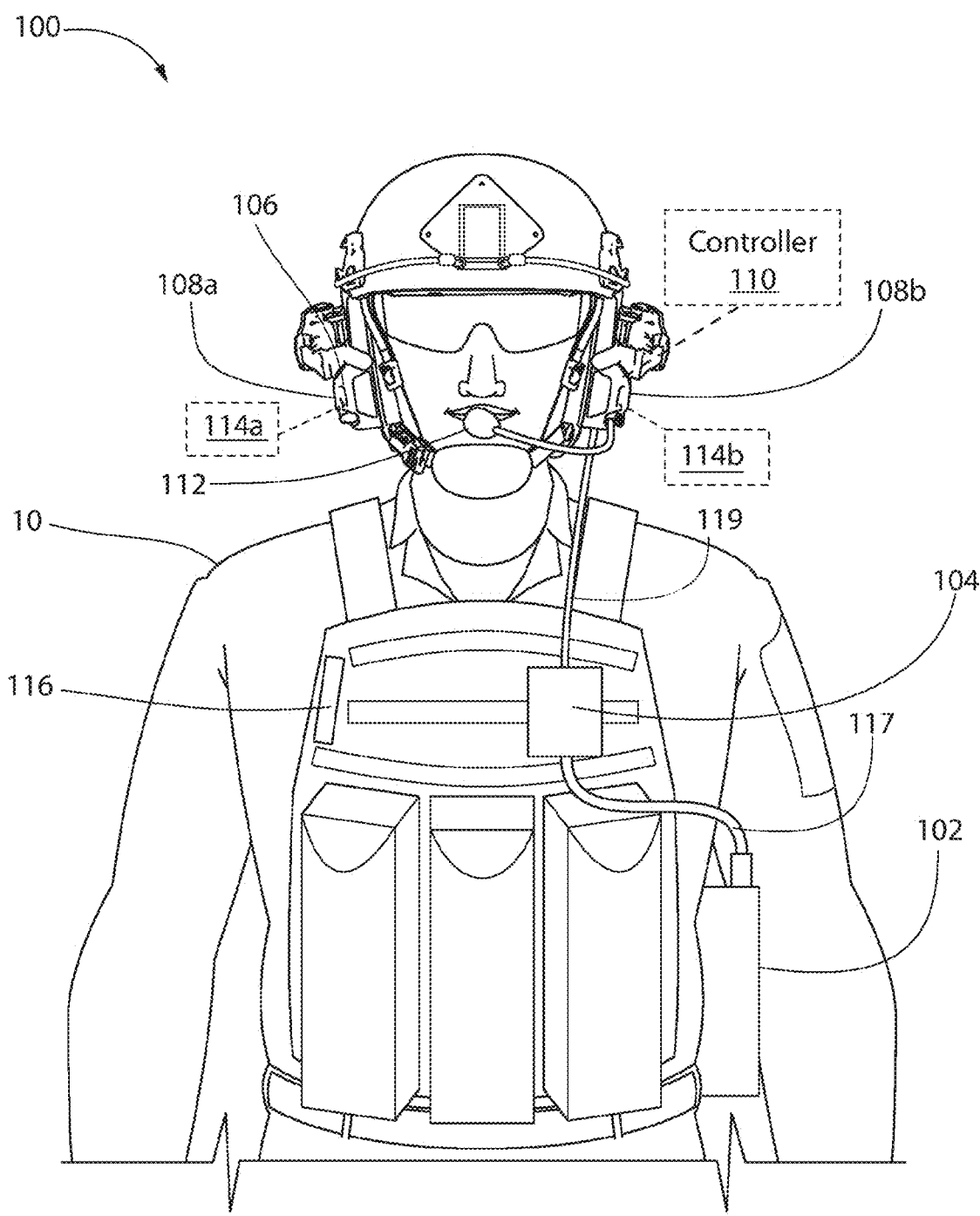
FIG. 1 is a schematic representation of an exemplary communication system for a user, according to at least one embodiment of the invention.

Referring to the drawings in detail, wherein like reference numerals indicate like elements throughout, there is shown in FIGS. 1-9 a communication system 100 for a user 10, generally designated, in accordance with an exemplary embodiment of the present invention.

Referring to FIG. 1, the communication system 100 may include at least one of: a radio 102, a push-to-talk (PTT) handset 104, a headset 106 which may include right and left earcups 108a-108b, a controller 110, a microphone 112, and right and left ambient sound microphones 114a-114b.

The radio 102 may be configured to transmit and/or receive radio signals using an antenna. In some embodiments, the radio 102 may be a plurality of radios, each configured to receive a separate and distinct radio signal. The radio 102 may be configured to decode or demodulate the radio signals and provide an audio signal representative of the radio signals that can be used by the headset 106 and earcups 108a-b to drive a speaker configured to produce sounds audible to the user 10. In addition, the radio 102 may be configured to receive audio signals from the microphone 112, encode or modulate the audio signals, and transmit radio signals representative of the audio signal to external sources (e.g., another radio).

The handset 104 may be configured to toggle the radio 102 between transmission and reception of the radio signals. Handset 104 may be connected to radio 102 through cable 117 and may be connected to headset 106 via cable 119. The radio 102 may be toggled by the user via the handset 104. For example, the handset 104 may include a pushbutton (not shown). If the pushbutton is activated by the user, the handset 104 toggles the radio 102 to operate in a transmission mode. In the transmission mode, the handset 104 may toggle the radio 102 to transmit an audio signal received from the microphone 112. If the pushbutton is not activated by the user, the handset 104 toggles the radio 102 to operate in a reception mode. In the reception mode, the handset 104 may receive an audio signal from an external source terminal and deliver it to the left and right earcups 108a-108b.

The handset 104 may be configured to transmit and receive audio signals over multiple radio channels. As used herein, the term "channel" may refer to a band of frequencies that correspond to a radio signal. The handset 104 may include a plurality of radio channel ports, each configured to receive a radio channel from one or more radios. One or more pushbuttons may be assigned to one or more radio channel ports to toggle the radios between transmission and reception of radio signals.

The handset 104 may be couplable to an accessory or clothing. In one embodiment, the handset 104 is removably coupled to a strap extending across a user's chest such that the handset is quickly accessible by at least one hand. In one embodiment, the handset is configured to couple to webbing 116. Webbing 116 may be modular lightweight load-carrying equipment (e.g., MOLLE) webbing or pouch attachment ladder system (PALS) webbing, among others. In some embodiments, the webbing 116 is comprised of heavy-duty nylon. The webbing 116 may be stitched onto a vest of the user 10 to allow for the attachment of various compatible pouches and accessories. The webbing 116 may include one or more horizontal rows of approximately 1 inch (2.5 cm) webbing. Each of the horizontal rows of the webbing 116 may be spaced 1 inch apart. The webbing 116 may be attached to a backing at 1.5 inch (3.8 cm) intervals.

Microphone 112 may be configured to convert sound produced by the user into an electrical audio signal. The electrical audio signal from the microphone 112 may be transmitted to the radio 102 for wireless broadcasting.

The controller 110 may be configured to improve communication functionality for this user. In some embodiments, the controller 110 is a microprocessor having memory. The memory may include one or more programs that when executed by a processor, cause the processor to perform one or more functions described herein. In some embodiments, the controller may include passive electrical components that are configured to process audio signals to perform one or more functions described herein.

Hear-Through Limiter

With continued reference to FIG. 1, right and left ambient sound microphones 114a-b may be configured to convert external sound around the user into an electrical audio signal. The electrical audio signal from the right and left ambient sound microphones 114a-b may be transmitted to the earcups 108a-b to drive a speaker configured to produce sounds audible to the user 10. Depending on the application or circumstance, the earcups 108a-108b can be configured to muffle external ambient sounds for the user to allow the user to hear a radio communication more clearly. However, in other instances the user may need to hear external ambient sounds to properly observe the user's surroundings. In certain instances, such as when there is no received radio communication, the ambient sound microphones 114a-114b are configured to allow the user to hear external ambient sounds even if the earcups 108a-108b have a sound muffling effect on the user's hearing ability.

Figure 2:
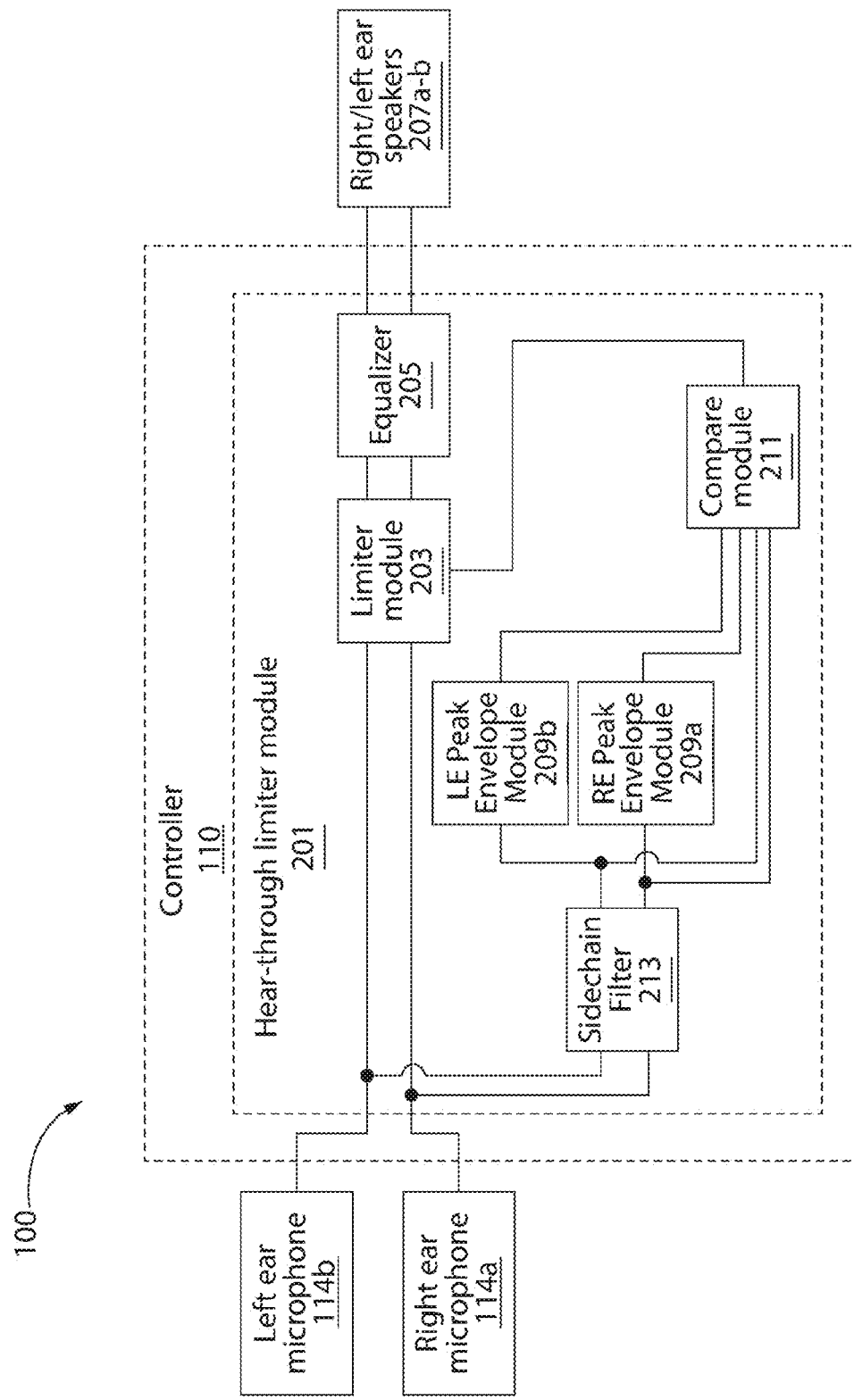
FIG. 2 is a schematic representation of a portion of the communication system of FIG. 1 for limiting peak values of an audio signal produced for the user, according to at least one embodiment of the invention.

FIG. 2 is a representation of a portion of the communication system 100 of FIG. 1 for limiting peak values of an audio signal produced for the user 10, according to at least one embodiment of the invention. As discussed above, and also as illustrated in FIG. 2, the communication system 100 may include right and left ambient sound microphone 114a-b to allow a user 10 to hear surroundings while wearing headset 106 and potentially sound-muffling earcups 108a-108b. The audio signals from the right and left ambient sound microphone 114a-b are processed by controller 110 before being transmitted to the right and left ear speakers 207a-b, positioned within the earcups 108a-b for producing sound audible to the user 10. In some embodiments, the controller 110 includes a hear-through limiter module 201 configured to prevent unsafe sound levels from reaching the ear of the user 10 by actively adjusting and attenuating the hear-through gain to keep the sound level below a set limit. The audio signal received at the hear-through limiter module 201 may be monitored to estimate the instantaneous level of that signal and the gain may be dynamically adjusted to control the sound reaching the ear of the user. To adjust the gain appropriately, the two signals may be compared and the signal with the highest instantaneous level may be used to determine the gain needed to control the sound reaching both ears.

The hear-through limiter module 201 may include at least one of a sidechain filter module 213, right ear peak envelope module 209a, left ear peak envelope module 209b, compare module 211, limiter module 203 and equalizer module 205.

The sidechain filter module 213 may receive the right ear audio signal from right ambient sound microphone 114a and the left ear audio signal from left ambient sound microphone 114b. In some embodiments, the right ear audio signal and left ear audio signal may be replaced by another audio signal representative of sound. In some embodiments, the right and left ambient sound microphones 114a-b are replaced by another audio source configured to produce an audio signal. The sidechain filter module 213 may be configured to limit modulation applied to the left ear audio signal and the right ear audio signal at certain frequencies. To adjust the frequency-dependent behavior of the hear-through limiter module 201 without affecting the frequency content of the sound reaching the ear, the hear-through signals may be cloned and then passed to the sidechain filter module 213 prior to being used to determine the signal gain at the limiter module 203. Using the sidechain filter module 213, specific frequency ranges can be emphasized or deemphasized. For example, at certain frequencies, the decibels may be limited to approximately 95 dB, 85 dB, or 75 dB.

In some embodiments, the right ear (RE) peak envelope module 209a and the left ear (LE) peak envelope module 209b may each receive the corresponding right or left filtered audio signal from sidechain filter 213. Alternatively, in some embodiments that do not include the sidechain filter 213, right ear peak envelope module 209a and the left ear peak envelope module 209b may each receive the right ear audio signal from right ambient sound microphone 114a and the left ear audio signal from left ambient sound microphone 114b. The peak envelope modules 209a-b each may calculate an instantaneous peak value representative of the magnitude of the received filtered audio signal at predetermined sampling intervals. In some embodiments, the sampling interval is approximately 32 kHz. In one embodiment, the sampling interval of approximately 32 kHz is used for one or more modules shown in FIG. 2. The peak envelope modules 209a-b each may compute the instantaneous value of the magnitude of the received filtered audio signal using an exponential decaying peak hold function. The peak envelope modules 209a-b each may compare a current peak value of a sampled audio signal to a previous peak value of the sampled audio signal. The peak envelope modules 209a-b each may determine whether the current peak value of the sampled audio signal is greater than, or less than, the previous peak value of the sampled audio signal. In response to a determination that the current peak value of the sampled audio signal is greater than the previous peak value of the sampled audio signal, the respective peak envelope module 209a-b may output the current peak value of the sampled audio signal. In response to a determination that the current peak value of the sampled audio signal is less than the previous peak value of the sampled audio signal, the respective peak envelope module 209a-b may output the previous peak value of the sampled audio signal.

In one embodiment, by using an exponentially decaying peak hold function, the peak envelope modules 209a-b minimizes the number of times that switching occurs between the two different audio signals in later steps. In some embodiments, the exponentially decaying function (A) is:

$$A = A_o * e^{-k(t-h)}$$

wherein:
$A_o$ is a measured peak value of an audio signal,
k is a rate of decay,
h is a hold time before the exponential decaying function is initiated,
t is time.

In some embodiments, the hold time (h) is 0 ms. In some embodiments, the rate of decay (k) is 1000 $s^{-1}$.

In some embodiments, the output of the peak envelope module (y) is:

$$y(t_2) = \begin{cases} A & \text{if } A > c * y(t_1) \\ c * y(t_1) & \text{if } A \leq c * y(t_1) \end{cases}$$

Wherein:
- A is a measured peak value of an audio signal,
- c is a decay coefficient, with a value between 0 and 1,
- $y(t_1)$ is the previous value of the peak envelope module 204 output,
- $y(t_2)$ is the new value of the peak envelope module 204 output.

While FIG. 2 shows right ear peak envelope module 209a and left ear peak envelope module 209b, in some embodiments, a single peak envelope module may be used to perform any of the functionality described with respect to the right ear peak envelope module 209a and left ear peak envelope module 209b.

Compare module 211 may receive a right ear instantaneous peak value from the right ear peak envelope module 209a and a left ear instantaneous peak value from the left ear peak envelope module 209b. Compare module 211 may receive a right ear audio signal and a left ear audio signal from sidechain filter 213. Alternatively, in some embodiments that do not include the sidechain filter 213, compare module 211 may receive a right ear audio signal and a left ear audio signal from the right ambient sound microphone 114a and the left ambient sound microphone 114b. The compare module 211 may generate a peak comparison audio signal representative of either the right ear audio signal or the left ear audio signal based on whether the right ear instantaneous peak value is greater than, or less than, the left ear instantaneous peak value. For example, in some embodiments, compare module 211 may compare the right ear instantaneous peak value and the left ear instantaneous peak value. The compare module 211 may determine whether the right ear instantaneous peak value is greater than, or less than, the left ear instantaneous peak value. In response to a determination that the right ear instantaneous peak value is greater than the left ear instantaneous peak value, the compare module 211 may generate or output a peak comparison audio signal representative of the right ear audio signal. In response to a determination that the right ear instantaneous peak value is less than the left ear instantaneous peak value, the compare module 211 may generate or output a peak comparison audio signal representative of the left ear audio signal.

Limiter module 203 may receive the left ear audio signal from the left ear microphone 114b signal and the right ear audio signal from the right ear microphone 114a. The limiter module 203 may also receive the peak comparison audio signal from the compare module 211. The limiter module 203 may selectively attenuate the left ear microphone signal and the right ear microphone signal based on whether the peak comparison audio signal exceeds a predetermined limit threshold. For example, in some embodiments, the limiter module 203 may compare an amplitude of the peak comparison audio signal to the predetermined limit threshold and determine whether the amplitude of the peak comparison audio signal exceeds the predetermined limit threshold. In response to a determination that the amplitude of the peak comparison audio signal is greater than the limit threshold, the limiter module 203 may apply an attenuation factor to each of the left ear audio signal and the right ear audio signal. In some embodiments, the attenuation factor is a ratio of the predetermined limit threshold and the amplitude of the peak comparison audio signal. In response to a determination that the amplitude of the peak comparison audio signal is less than the limit threshold, the limiter module 203 may refrain from applying an attenuation factor to each of the left ear audio signal and the right ear audio signal.

In some embodiments, before the right ear audio signal and the left ear audio signal are transmitted to the right and left ear speakers 207a-b, the equalizer module 205 receives the left ear audio signal and the right ear audio signal from the limiter module 203. The equalizer module 205 may modify the left ear audio signal and the right ear audio signal using one or more linear filters. In some embodiments, the equalizer module 205 may modify the left ear audio signal and the right ear audio signal using one or more linear filters at certain frequencies. Modifying the audio signals may help offset the frequency response of the microphones 114a-b and the speakers 207a-b. Modifying the audio signals may also help accentuate certain high or low frequencies. The equalizer module 205 may then transmit the equalized right ear audio signal and the equalized left ear audio signal to the respective right and left ear speakers 207a-b for producing sound audible to the user 10.

While the right and left ear speakers 207a-b are shown as exemplary audio reception devices in FIG. 2, in some embodiment, other audio reception devices configured to receive an audio signal may be used.

In some embodiments, the positions of the limiter module 203 and equalizer module 205 may be interchanged such that the limiter module 203, rather than the equalizer module 205, may transmit the equalized right ear audio signal and the equalized left ear audio signal to the respective right and left ear speakers 207a-b for producing sound audible to the user 10.

Low-Distortion Transmission Module

Figure 3A:
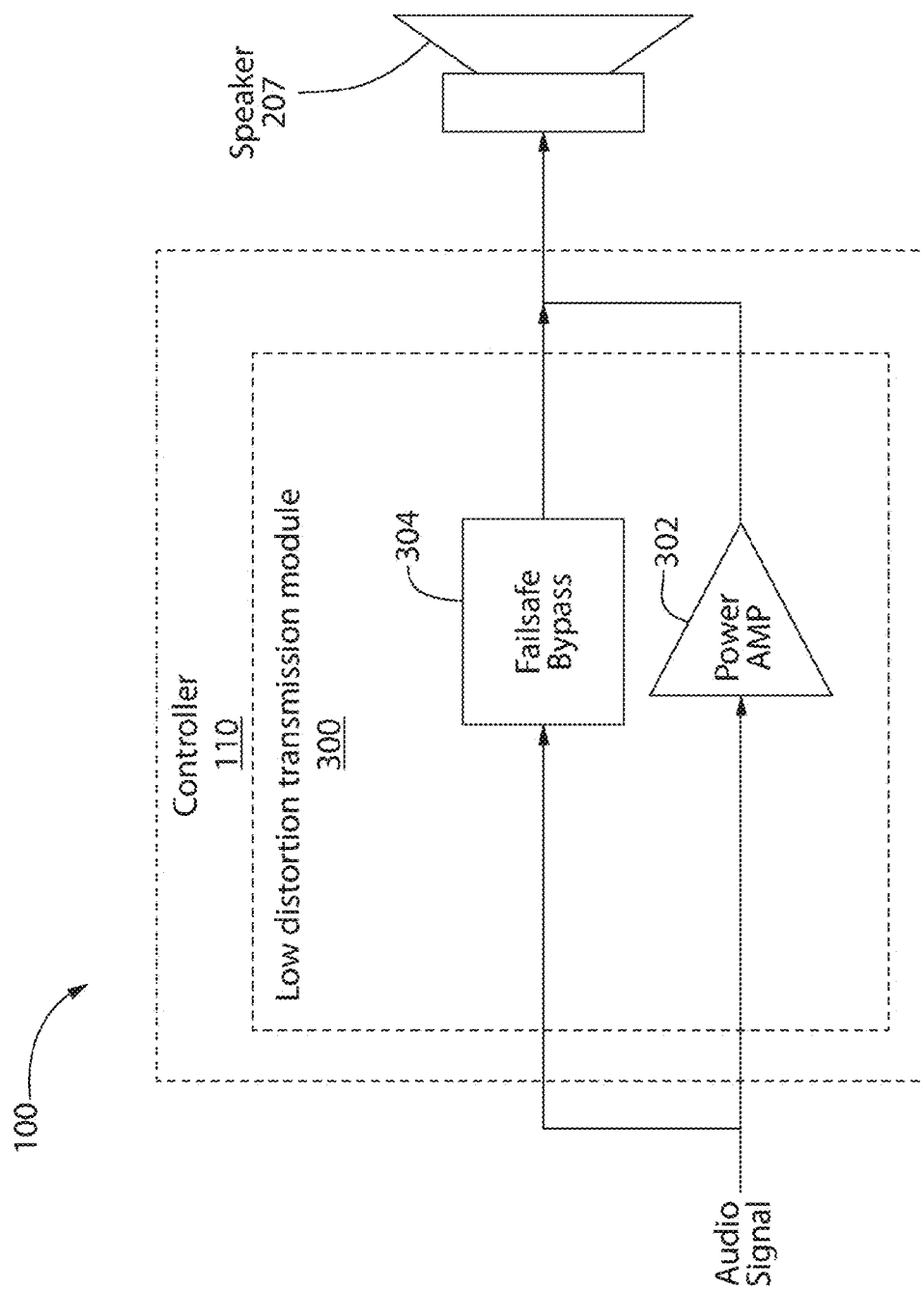
FIG. 3A is a conceptual representation of a portion of the communication system of FIG. 1 for a low distortion transmission of an audio signal produced for the user, according to at least one embodiment of the invention.

As discussed above, the communication system 100 may include an audio source device (e.g., radio 102 shown in FIG. 1) that produces an audio signal transmitted to speaker 207. Referring to FIG. 3A, the audio signal may be transmitted to speaker 207 via controller 110. The controller 110 may include a low distortion transmission module 300 configured to drive the speaker 207. The low distortion transmission module 300 may include a power amplifier 302 and a failsafe bypass module 304. If the controller 110 receives power from a power source, such as a battery, the power amplifier 302 is operable to amplify the audio signal to drive speakers 207 to produce audible sound to the user 10. If the controller 110 does not receive power from the power source, the power amplifier 302 is inoperable to amplify the audio signal to drive speaker 207 to produce audible sound to the user 10. Instead, the failsafe bypass module 304 may transfer the audio signal to the speaker 207, with the power from the audio signal driving the speaker 207 to produce sound.

Figure 3B:
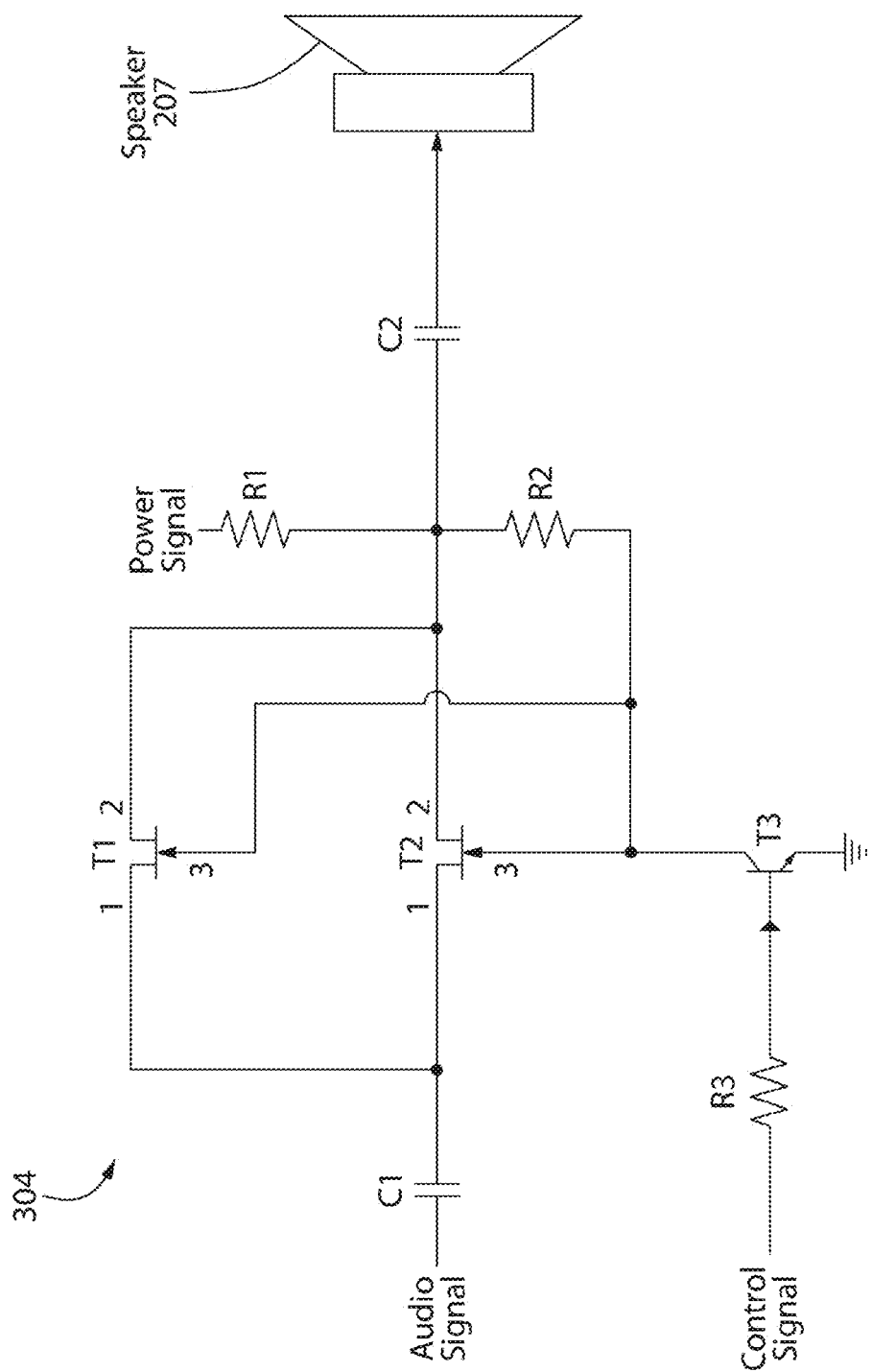
FIG. 3B is a schematic representation of the failsafe bypass module of FIG. 3A, according to at least one embodiment of the invention.

Referring to FIG. 3B, the failsafe bypass module 304 may include first and second signal path transistors T1-T2 and a bypass activation transistor T3. The bypass activation transistor T3 and the first and second signal path transistors T1-T2 may operate in an open state or a closed state. When T3 is in an open state, the transistors T1-T2 operate similar to a closed switch, where current flows freely between the source terminal and drain terminal. In this configuration, the source terminal and drain terminal of the signal path transistors T1-T2 may share a similar voltage potential. When T3 is in a closed state, the transistors T1-T2 operate similar to an open switch, where current flow is impeded and the source terminal and drain terminal each have independent voltage potentials.

The first and second signal path transistors T1-T2 may be junction gate field-effect transistors. The bypass activation transistor T3 may be a bi-polar junction transistor. In some embodiments, transistors T1-T3 are replaced by other transistor types and configurations that perform similar functions to transistors T1-T3 as described herein.

The source terminal of the first and second signal path transistors T1-T2 may be connected (or also referred to herein as "in electrical communication with") to the audio signal. In one embodiment, the gate terminals of the first and second signal path transistors T1-T2 are connected to collector/drain of T3. The drain terminal of the first and second signal path transistors T1-T2 may be connected to the speaker 207. The drain terminal of the first and second signal path transistors T1-T2 may also be connected to the power signal, optionally via resistor R1, to bias the first and second signal path transistors T1-T2. The drain terminal of the first and second signal path transistors T1-T2 may be connected to the collector/drain terminal of the bypass activation transistor T3. In some embodiments, the drain terminal of the first and second signal path transistors T1-T2 may be connected to the collector/drain terminal of the bypass activation transistor T3 via a resistor R2. The base/gate terminal of the bypass activation transistor T3 may be connected to a control signal provided from an external source terminal, such as a microprocessor. The emitter/source terminal of the bypass activation transistor T3 may be connected to ground.

In some embodiments, a capacitor C1 may be positioned between the source terminal of the first and second signal path transistors T1-T2 and the audio signal. In some embodiments, a capacitor C2 may be positioned between the drain terminal of first and second signal path transistors T1-T2 and the speaker 207. The capacitors C1-C2 may be approximately 100 microfarads. Using capacitors C1-C2 may ensure that there is DC filtering of the audio signal without interfering with the audio band of the audio signal.

In some embodiments, a resistor R1 may be positioned between the drain terminal of first and second signal path transistors T1-T2 and the power signal. In some embodiments, a resistor R2 may be positioned between the drain terminal of first and second signal path transistors T1-T2 and the collector/drain terminal of the bypass activation transistor T3. The resistor R1 may be approximately 10 k Ohms. The resistor R2 may be approximately 500 k Ohms. The resistors R1-R2 may bias the first and second signal path transistors T1-T2 to operate in a closed state while receiving power via the power signal.

In some embodiments, a resistor R3 may be positioned between the base/gate terminal of the bypass activation transistor T3 and the control signal. The resistor R3 may be approximately 100 k Ohms. The resistor R3 along with bypass activation transistor T3 may be configured to control the first and second signal path transistors T1-T2 via the control signal without using a lot of power from any external power source terminals for the failsafe bypass module 304.

If power is provided to the controller 110 in FIG. 3A, the power signal and/or control signal of FIG. 3B may be logic level high (also referred to herein as "a high level"). In response to the power signal and/or control signal being logic level high, the bypass activation transistor T3 may operate in a closed state. While the bypass activation transistor T3 operates in a closed state, the collector/drain terminal of the bypass activation transistor T3 may be pulled to ground turning off first and second signal path transistors T1-T2. In addition, the gate terminals of the first and second signal path transistors T1-T2 may also be connected to ground. In response to the gate terminals of the first and second signal path transistors T1-T2 being connected to ground, the first and second signal path transistors T1-T2 may operate in an open state. While the first and second signal path transistors T1-T2 operate in an open state, the audio signal may not pass through to speaker 207. Instead, as shown in FIG. 3A, the audio signal will be transmitted to speaker 207 via the amplifier 302.

If power is lost and not provided to the controller 110 in FIG. 3A, the power signal and control signal of FIG. 3B may be logic level low (also referred to herein as "a low level"). In response to the power signal and control signal being logic level low, the bypass activation transistor T3 may operate in an open state. If the bypass activation transistor T3 operates in an open state, the emitter/source terminal and collector/drain terminal of the bypass activation transistor T3 may have independent voltage potentials. If power is lost and not provided to the controller 110 in FIG. 3A, the audio signal may leak through the source terminal of the first and second signal path transistors T1-T2 to the gate terminal of the first and second signal path transistors T1-T2 via the drain terminal of the first and second signal path transistors. The leaked audio signal may cause the first and second signal path transistors T1-T2 to automatically operate in a closed state, a phenomenon also known as "self turn on." The audio signal may pass to the speaker 207 to drive the speaker 207 to produce sound audible to the user 10.

"Self turn on" can result in an increase in total harmonic distortion in the audio signal. If the failsafe bypass module 304 is partially on while the main power amplifier 302 is on, the audio signal sums into the audio path and causes signal distortion. As used herein, the term total harmonic distortion refers to the distortion produced by an amplifier (e.g., speaker 207), as measured in terms of the harmonics of the sinusoidal components of the signal that the signal introduces. As the total voltage of the input audio signal increases, total harmonic distortion increases without increasing fundamental audio signal. In some embodiments, and as shown in FIG. 3B, the first and second signal path transistors T1-T2 may be electrically connected in parallel. By connecting the first and second signal path transistors T1-T2 in parallel, impedance caused by the first and second signal path transistors T1-T2 is reduced. Reducing the impedance caused by the first and second signal path transistors T1-T2, reduces the effects of "self turn on" and total harmonic distortion on the audio signal decreases while maintaining the voltage of the audio signal transmitted to the speaker 207 to drive the speaker 207 to produce sound audible to the user 10.

While a speaker 207 is shown in FIGS. 3A-3B, other audio reception devices may be used in some embodiments, including, but not limited to a transmission coil that transmits an electromagnetic signal using near-field magnetic induction to a corresponding earplug that includes a receiving coil configured to receive the electromagnetic signal, and a speaker configured to produce sound based on the electromagnetic signal.

Multichannel Mixing Passive PTT

Referring back to FIG. 1, in some embodiments, the communication system 100 may include a push-to-talk handset 104. The push-to-talk handset 104 may be a device that allows for instantaneous communication with others. The push-to-talk handset 104 may include user-selectable button to switch the push-to-talk handset 104 from voice transmission mode to voice reception mode. In some embodiments, the push-to-talk handset 104 may include multichannel functionality, meaning the push-to-talk handset 104 can receive separate and distinct audio signals from one or more audio sources. For multichannel functionality, the electronic circuitry can be complex and may require external power, further programming and/or additional training prior to use. Thus, there is a need for a push-to-talk handset 104 that is usable without programming or significant adjustments ("plug and play"), easy to use, and does not require an internal or alternate power source.

Figure 4:
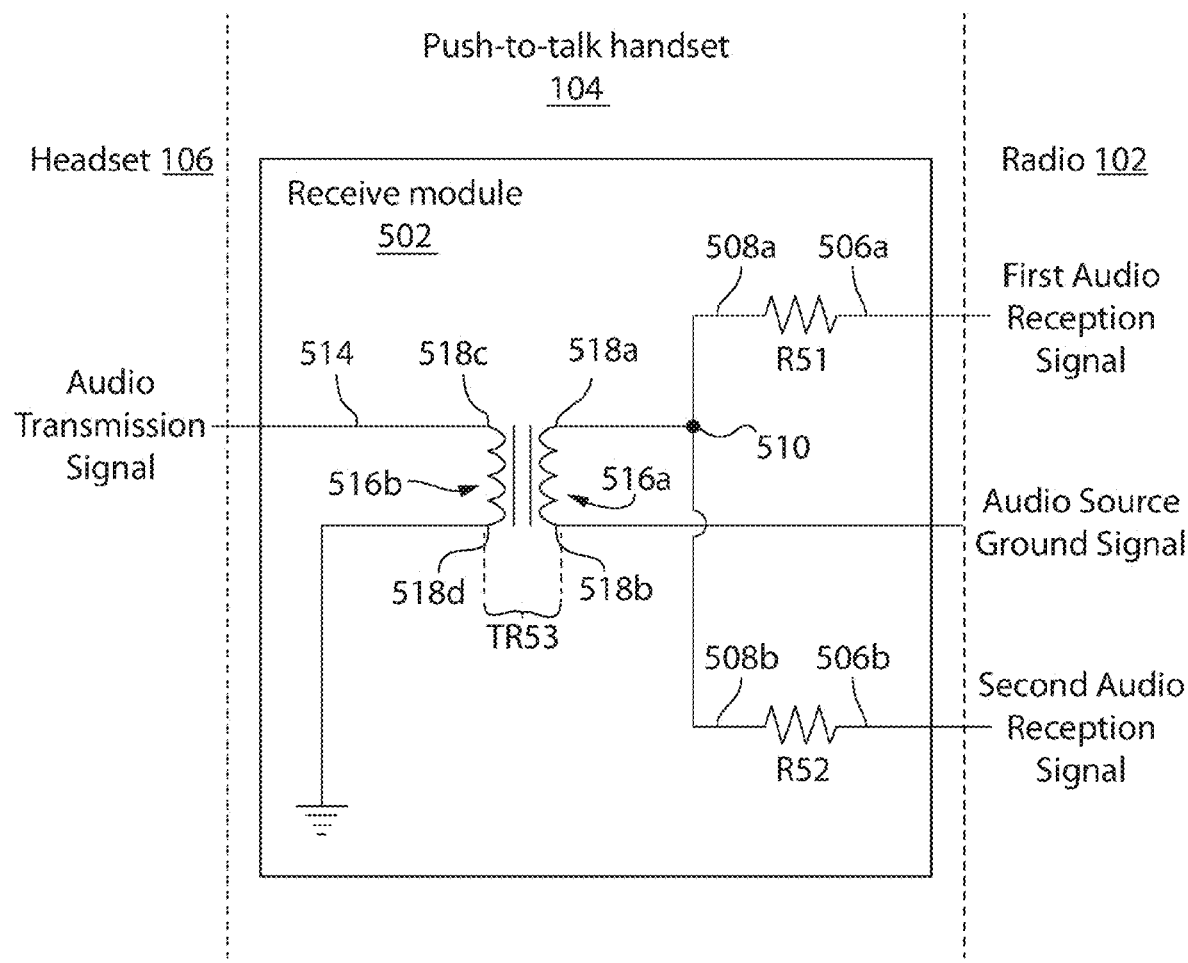
FIG. 4 is a schematic representation of an exemplary receive module implementable in the push-to-talk handset of FIG. 1, according to at least one embodiment of the invention.

Referring to FIG. 4, the receive module 502 may be configured to receive a plurality of audio reception signals from one or more audio sources and produce a corresponding audio transmission signal representative of the sum of the audio reception signals. For example, in FIG. 4, the receive module may receive audio reception signals named first audio reception signal and second audio reception signal. The audio reception signals may be received from any audio source, such as radio 102 shown in FIG. 4 or an intercom, among others.

The receive module 502 may include one or more summing resistors. Each of the summing resistors may receive a respective audio reception signal at a respective first terminal of each summing resistor. For example, as shown in FIG. 4, the receive module 502 may include a first summing resistor R51 and a second summing resistor R52. The first summing resistor R51 may receive the first audio reception signal at a first terminal 506a of the summing resistor R51. The second summing resistor R52 may receive the second audio reception signal at a first terminal 506b of the summing resistor R52.

Each of the summing resistors may include second terminals that are each connected at a summing node. For example, as shown in FIG. 4, the first summing resistor R51 and the second summing resistor R52 include second terminals 508a-b, respectively, that are each connected at a summing node 510. At the summing node 510, due to the configuration of the summing resistors, the first audio reception signal and the second audio reception signal are summed to create a summed audio signal. By summing the audio reception signals using passive components such as resistors and transformers, the push-to-talk handset 104 can generate the summed audio signal without the use of external power sources, such as a battery or external DC power.

The receive module 502 may include a transformer TR53. The transformer TR53 may be configured to receive the summed audio signal at summing node 510 and produce an audio transmission signal at node 514. The audio transmission signal may be transmitted to an audio reception device configured to receive an audio signal. For example, in FIG. 4, the audio reception device is headset 106.

The transformer TR53 may include a first coil 516a and a second coil 516b. The first coil 516a may include a first terminal 518a and a second terminal 518b. The first terminal 518a may be connected to summing node 510. The second terminal 518b may be connected to an audio source ground signal. By being connected to an audio source ground signal, the transformer TR53 can allow the push-to-talk handset 104 to "float the ground" or isolate the grounds from input to output so that the first and second audio reception signals may be received from two separate audio sources with their respective returns connected together. In FIG. 4, transformer TR53 may float the ground represented by the audio source ground signal. The second coil 516b may include a first terminal 518c and a second terminal 518d. The second coil 516b may produce the audio transmission signal at first terminal 518c in response to receiving the summed audio signal at summing node 510. The second terminal 518d may be connected to ground.

In some embodiments, the components of the receive module 502 may be duplicated to add a separate and distinct second audio transmission signal summed from a second set of audio reception signals.

In some embodiments, additional audio reception signals can be added to the receive module 502 by also adding, for each additional audio reception signal, a corresponding resistor that connects to summing node 510.

In some embodiments, receive module 502 may be duplicated such that two or more separate and distinct receive modules are configured to receive one or more audio transmission signals and each produce separate and distinct combined audio transmission signals that each may be transmitted via a cable to an ear of the user.

Figure 5A:
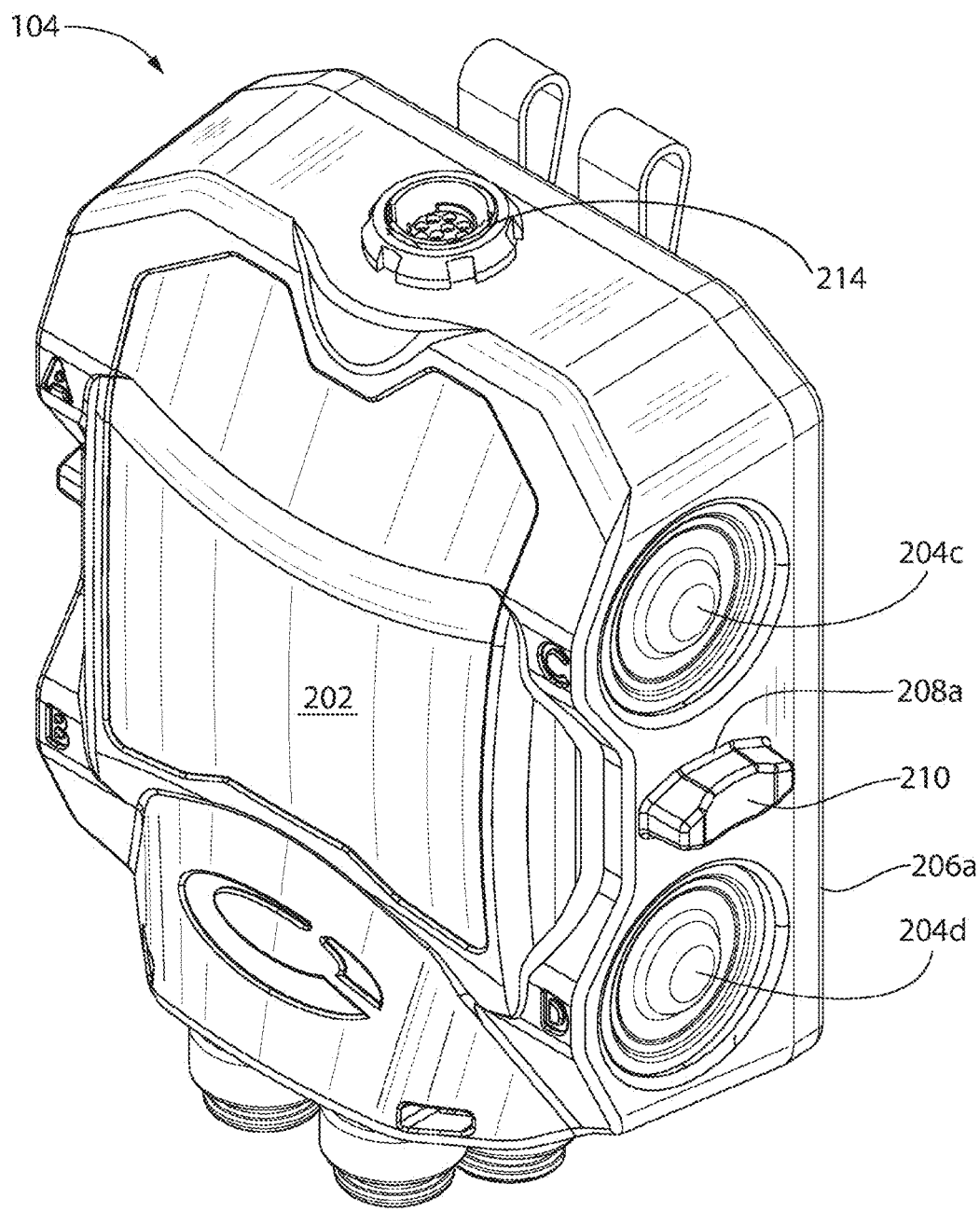
FIGS. 5A-5E are top perspective, front, top, bottom, and bottom perspective views, respectively, of the handset of FIG. 1, according to at least one embodiment of the invention.

Referring now to FIG. 5A, the handset 104 may be generally rectangular in shape. In one embodiment, the corners of the handset 104 are rounded or angled. The outer surface and edges may be convex or shaped to provide a distinctive appearance and to provide comfort in the palm of a user's hand when the user grabs the handset to actuate one or more of the buttons and discussed below. In one embodiment, the back surface is substantially flat. The back surface may be substantially flat to allow for rotation of the handset relative to the attachment clips as discussed in further detail below. In other embodiments, the back surface is concave or curved to conform to the accessory or clothing that the handset 104 is attached to. The front surface of the handset 104 may include a decal pocket 202. The decal pocket 202 may include a recessed area to help align a decal applied to the handset 104 and help protect the peripheral edge of the decal from peeling off of the handset 104.

The handset 104 may include one or more channels. In some embodiments, the handset 104 may include one, two, three or four channels. Each of the one or more channels may be a separate and distinct audio signal received from one or more radios, such as radio 102 in FIG. 1. In some embodiments, the one or more radios may be dual-channel. As used herein, the term "dual-channel" may refer to a radio that provides two or more distinct audio signals.

The handset 104 may include a plurality of buttons (e.g., buttons 204c-d in FIG. 5A and buttons 204a-b in FIG. 5E) (also referred to herein as switches). In FIG. 5A, two buttons 204c-d are positioned on a first sidewall 206a of the handset 104. In FIG. 5E, the two other buttons 204a-b are positioned on a second sidewall 206b of the handset 104. Each of the buttons 204a-d may be labeled with indicia (e.g., A, B, C, or D as shown in FIG. 5A) to identify the respective button to the user 10. Each of the buttons 204a-d may correspond to at least one separate and distinct channel. Each button may operate in an on state and an off state. When selected, the corresponding button operates in an on state where the handset 104 receives a user speech audio signal representative of speech from a headset of a user and selectively transmits the user speech audio signal from a radio connected to a corresponding channel. The first sidewall 206a and second sidewall 206b may be approximately perpendicular to a back surface 230 (shown in FIG. 5E). The first sidewall 206a may be approximately parallel to second sidewall 206b. A distance between the first sidewall 206a and second sidewall 206b may be approximately 2.35 inches (6 cm). If the user is wearing handset 104 on the webbing 116, the buttons 204a-d may be selectable by one or more digits (e.g., fingers) of the user 10. For example, the user 10 may select a button 204a-d using only a thumb or index finger of the user 10. The user 10 may select a button 204a-d using an index figure and middle finger of the user 10. The user 10 may select a button 204a-d using an index finger and ring finger of the user 10.

One or more of the buttons 204a-d may include a sounding action that occurs when the at least one of the buttons 204a-d is depressed. The sounding action may be an internal or external sound. The sounding action may be a mechanically-produced sound, wherein a power source may not be required. In one embodiment, the sounding action may be electrically-produced sound. The sounding action may be produced by a respective button 204a-d when the respective button 204a-d is depressed. The sounding action may be produced by a controller and speaker in the handset 104 in response to the respective button 204a-d being depressed. Characteristics of the sounding action may be adjustable by the user 10. For example, a volume level or a type of noise (e.g., click, beep) of the sounding action may be adjusted. The sounding action may have a volume level that is less than 55 dBA sound pressure level (SPL) measured at distance of approximately 1 meter. In some embodiments, one or more of the buttons 204a-d is a tactile dome switch. In some embodiments, one or more buttons 204a-d includes a dampener in the respective button 204a-d to reduce noise when the respective button 204a-d is pressed. In some embodiments, the dampener is made of rubber. In some embodiments, the dampener has a similar shape to the respective button 204a-d. In some embodiments, the dampener has a circular shape.

One or more of the buttons 204a-d may include a tactile feel that occurs if the respective button is depressed. Tactile feel feedback may include a clicking action and/or haptic feedback or vibration of the button or handset 104.

The buttons 204a-d may be recessed to minimize accidental activation. A top of at least one of the buttons 204a-d may be approximately coplanar with a corresponding sidewall 206a-b of the handset 104 when the respective button is in an un-pressed position. The top of at least one of the buttons 204a-d may fall below the corresponding sidewall 206a-b if the respective button is in the depressed position.

Figure 5B:
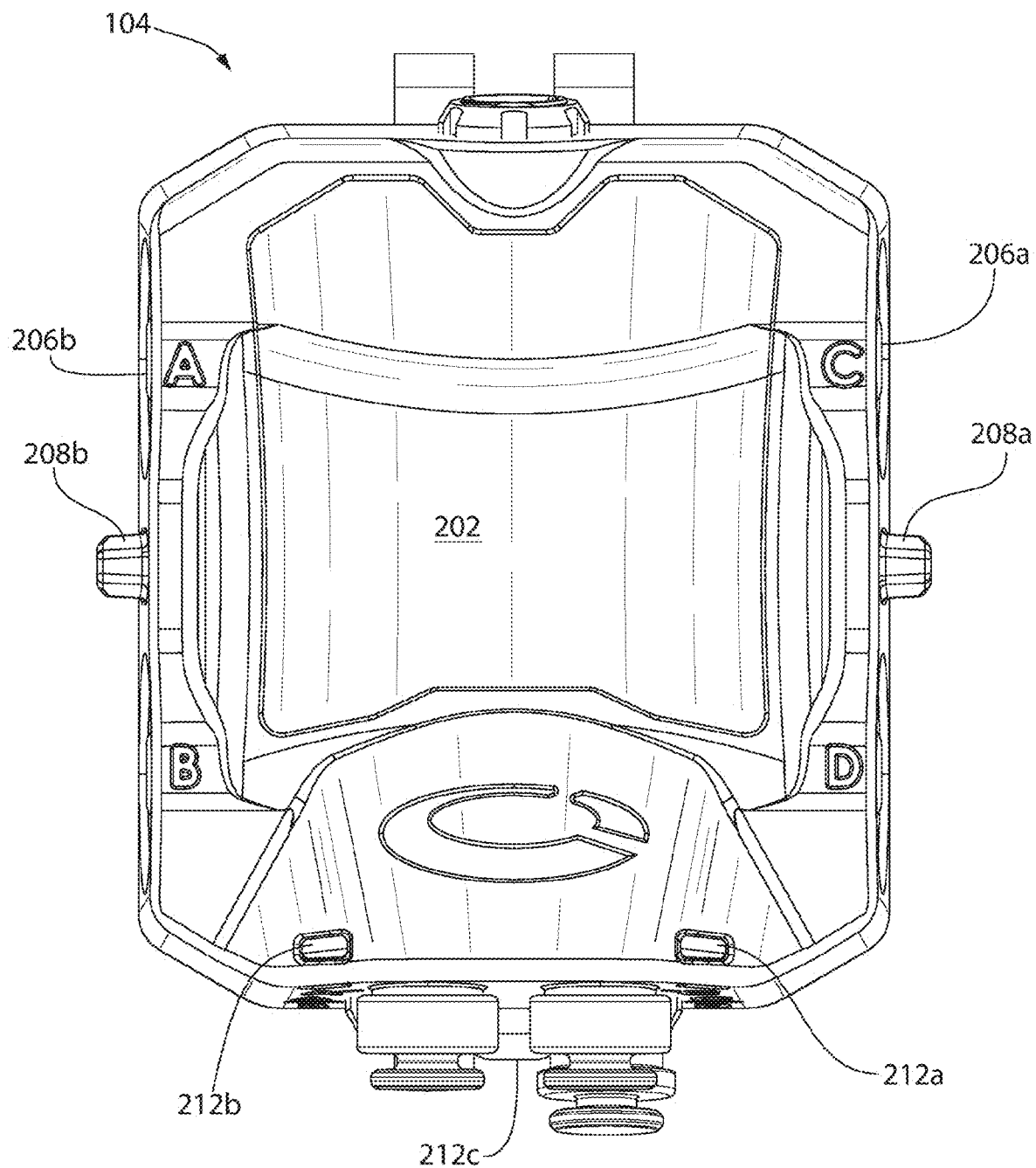

As shown in FIGS. 5A and 5B, the handset 104 may include a first protrusion 208a on a first sidewall 206a a second protrusion 208b on a second sidewall 206b of the handset 104. The protrusions 208a-b may extend outwardly from the respective sidewall 206a-b. A distance between a lateral end of the first protrusion 208a and a lateral end of the second protrusion 208b is approximately 2.58 inches (6.55 cm). The first protrusion 208a may be positioned between two buttons 204a-b on the first sidewall 206a of the handset 104. The second protrusion 208b may be positioned between two buttons 204c-d on the second sidewall 206b. By extending outwardly from a respective sidewall 206a-b, and by being positioned between two buttons, the protrusions 208a-b may minimize accidental activation and may also provide the user with an indication of which button the user is depressing. The protrusions 208a-b may also help orient the user to where each of the buttons 204a-d are so that the user can actuate the desired button 204a-d without having to look down at the handset 104.

One or more of the protrusions 208a-b may have a curved surface 210 (e.g., a scallop cut) to provide a perch to position a finger of the user 10 while the user 10 is grasping and using the handset 104. The one or more protrusions 208a-b may prevent accidental activation of the one or more buttons 204a-d.

As shown in FIG. 5B, the handset 104 may include a first lanyard attachment 212a and a second lanyard attachment 212b. The first lanyard attachment 212a and the second lanyard attachment 212b may connect to a cover for the remote PTT connectors of the handset 104. The handset may include a third lanyard attachment 212c. The third lanyard attachment 212c may connect to a cover for the radio connectors of the handset 104. Lanyard attachments 212a-212c each may include a loop shape with an opening configured to receive a portion of the cover for the PTT connectors or the radio connectors. One or more of the lanyard attachments 212a-c may be an opening in the housing of the handset 104 configured to receive a lanyard. The lanyard may be a low profile to prevent snags. The lanyard may be made from a soft material to prevent audible noise detection from the lanyard bumping against the housing of the handset 104 or some other piece of equipment on or near the user 10. In some embodiments, the lanyard is made of urethane.

Figure 5C:
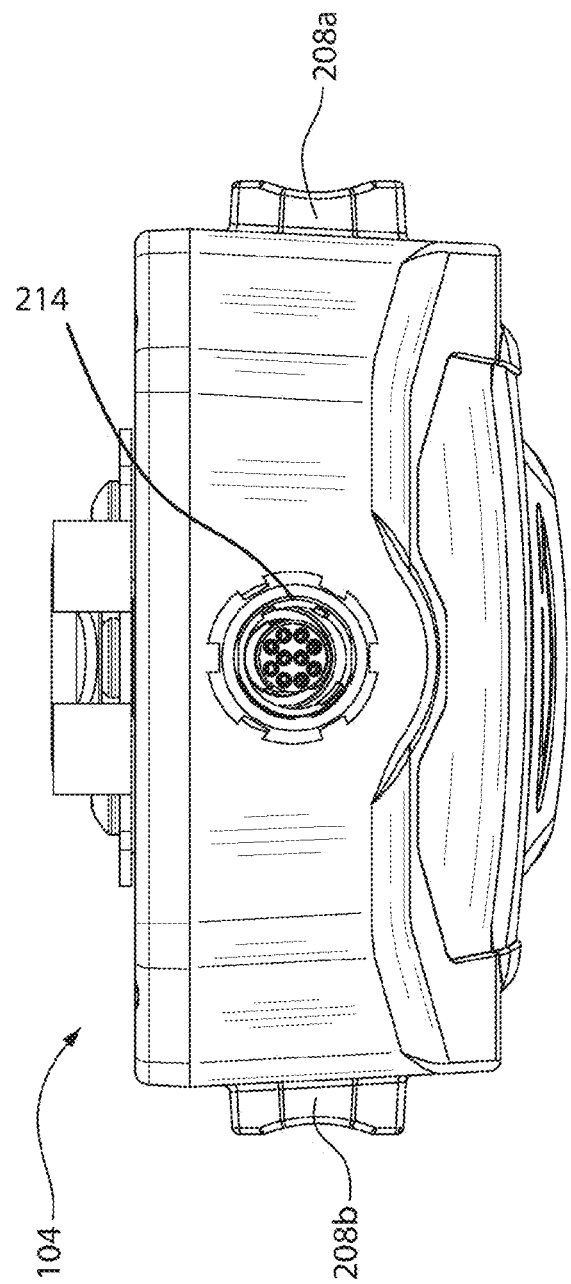

As shown in FIGS. 5A-5C, the handset 104 may include a headset connector 214 configured to receive a cable configured to connect a headset 106 to the handset 104. The headset connector 214 may include a waterproof seal.

Figure 5D:
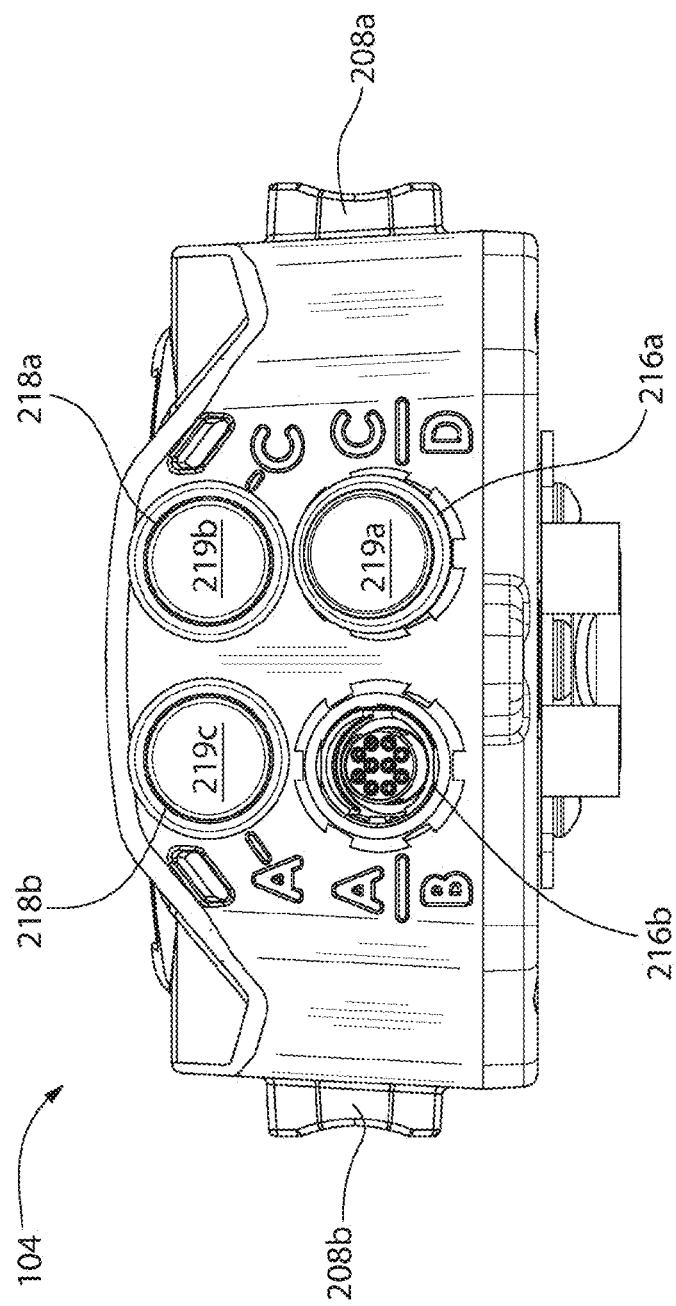
Figure 5E:
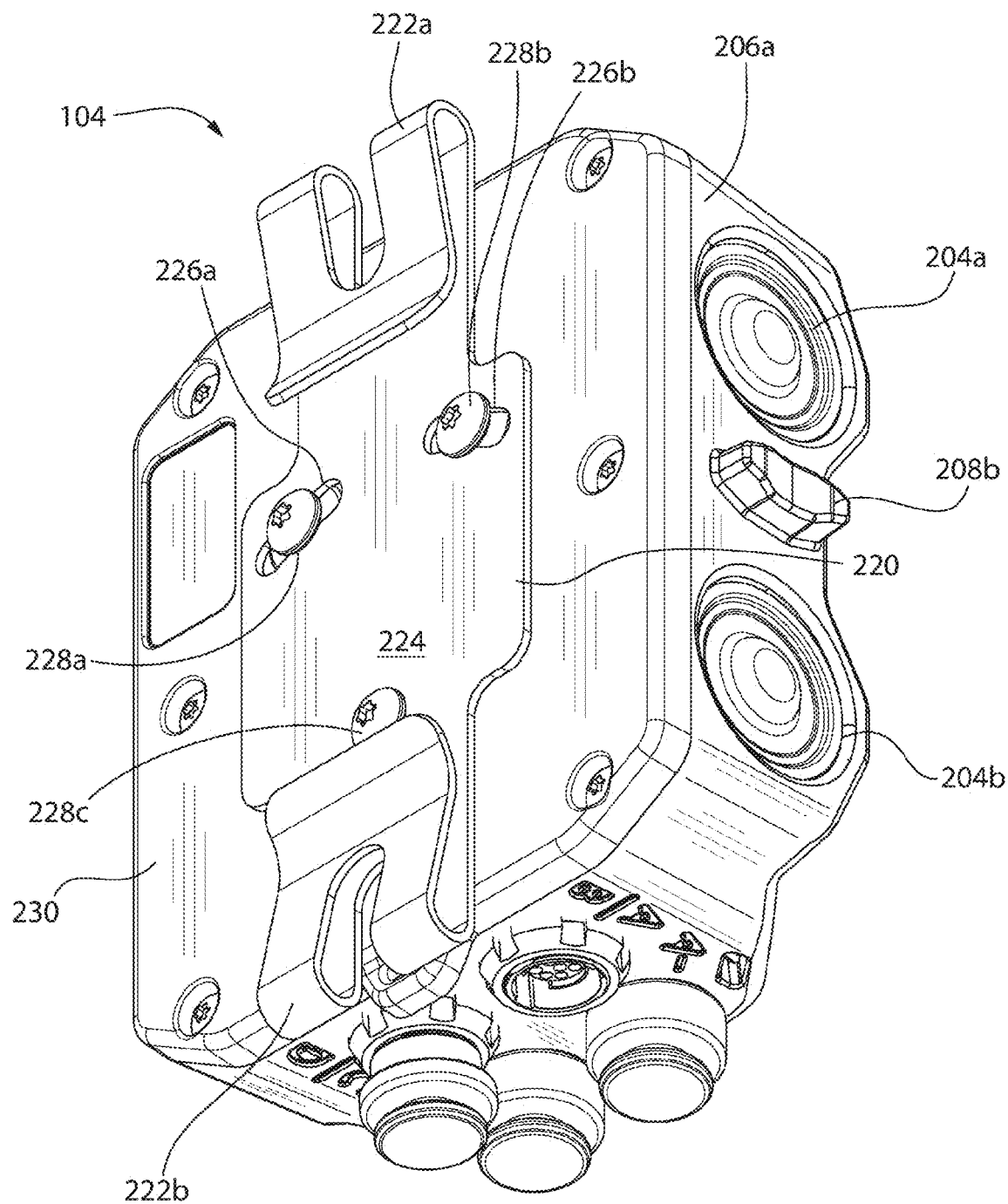

As shown in FIG. 5D, the handset 104 may include a first radio connector 216a and second radio connector 216b configured to connect the radio 102 to the handset 104. In some embodiments, one or more radio connectors 216a-b support a single channel radio that supports one radio frequency at a time for transmission or reception of an audio signal. In some embodiments, one or more radio connectors 216a-b support a dual channel radio configured to support one or two radio frequencies for transmission or reception of two audio signals independently and/or simultaneously. One or more radio connectors 216a-b may include a waterproof seal.

The handset 104 may include a first remote PTT connector 218a and a second remote PTT connector 218b configured to connect to one or more remote PTTs. The remote PTT may be a pushbutton connected to a wire that allows a user 10 to place the pushbutton at a different position on the body of the user 10 and activate the handset 104 using the pushbutton. One or more of the remote PTT connectors 218a-b may be a 2.5 mm jack. One or more of the remote PTT connectors 218a-b may include a waterproof seal. One or more of the remote PTT connectors 218a-b may be epoxy potted during assembly of the handset 104 to make the at least one of the remote PTT connectors waterproof.

The handset 104 may include a cover for each of the connectors 216a-b, 218a-b. For example, in FIG. 5D, covers 219a-c are positioned over connectors 216a, 218-a-b.

As shown in FIG. 5E, the handset 104 may include a clip 220. The clip 220 may include a top feature 222a and a bottom feature 222b. In some embodiments, the clip 220, optionally including the top feature 222a, bottom feature 222b and/or the center plate 224, is a unitary piece of material. The top feature 222a may be positioned at a top of the handset 104. The bottom feature 222b may be positioned at the bottom of the handset 104. The top feature 222a may be a predetermined distance from the bottom feature 222b. In some embodiments, after assembly of the handset 104, the distance between the top feature 222a and the bottom feature 222b is adjustable. The top feature 222a and bottom feature 222b may be configured to simultaneously couple to a top row and a bottom row of webbing 116 in FIG. 1. In some embodiments, the clip 220 is an alligator clip. The clip 220 may be stainless steel or plastic.

The clip 220 may include a center plate 224. The center plate 224 may include one or more holes. For example, in FIG. 5E, center plate 224 includes a first hole 226a and a second hole 226*b*. The first hole 226*a* and/or second hole 226*b* may each be slotted to allow the handset 104 to tilt or rotate relative to the features 222*a-b* about a plane generally coplanar with the rear surface of the handset 104. A range of tilt may be approximately 14 degrees from the longitudinal axis of the handset 104 in a clockwise and/or counter clockwise direction. The centerplate 224 may be fastened to the handset 104 using one or more fasteners (e.g., screws 228*a-c*) positioned in one or more holes (e.g., holes 226*a-b*) of the centerplate 224. For example, in FIG. 5E, screw 228*a* may be positioned in the first hole 226*a*, screw 228*b* may be positioned in the second hole 226*b* and screw 228*c* may be positioned in a third hole. The first hole 226*a* and/or second hole 226*b* may each be a curved slot to allow a circular rotation of the handset 104 about a center axis that is perpendicular to the back surface 230 of the handset 104. The handset 104 may be rotated relative to the features 222*a-b* by the user exerting a sufficient force to overcome the friction force between the handset 104 and the center plate 224. In one embodiment, adjusting the one or more fasteners (e.g., screws 228*a-b*) allows for adjustment of the force required to rotate the handset relative to the features 222*a-b*. In other embodiments, the handset 104 includes a lock and release mechanism that is selectively released to allow for rotating the handset 104 relative to the features 222*a-b* and/or positioning the handset 104 in a preferred position without needed to disengage the features 222*a-b* from the webbing, accessory, or clothing. Allowing the handset 104 to tilt or rotate relative to the features 222*a-b* may improve user preference or comfort (e.g., grip angle) for the user 10 during use and/or allow for movement of the handset 104 to prevent an electrical attachment from detaching from the handset 104 or being damaged when pulled.

NFMI Serial Port for Microprocessor

To operate certain functions of the communication system described herein, the controller 110 may include a microprocessor. During manufacturing, the microprocessor may require additional programming and/or communication during the assembly process. Ordinarily, wired connections from a manufacturing controller to the microprocessor would be required. However, wired connections can be costly and can wear out over time. Radio frequency (RF) communications may also be used, but RF communications require a substantial amount of energy. Thus, there is a need for a microprocessor that is configured to be programmed using a wireless connection.

Figure 6:
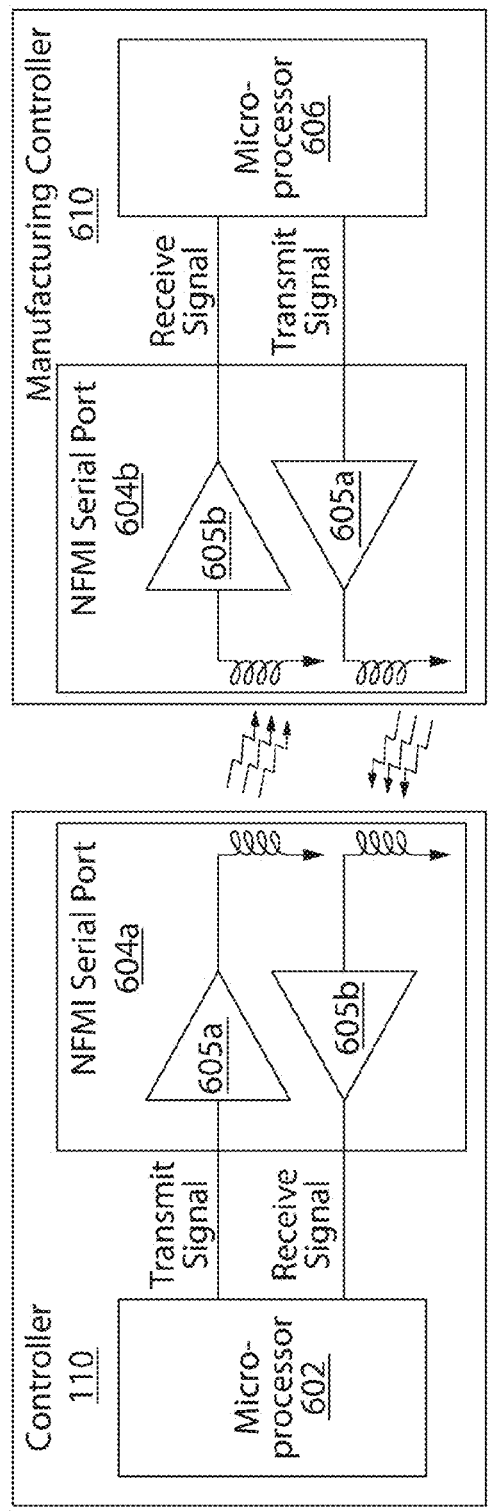
FIG. 6 is a conceptual representation of the controller wirelessly communicating with an external manufacturing controller, according to at least one embodiment of the invention.

Referring to FIG. 6, the controller 110 may include a microprocessor 602. The microprocessor 602 may be programmed using transmit and receive signals wirelessly exchanged with a manufacturing controller 610 having a corresponding microprocessor 606 (or e.g., any type of computer processing system). The signals are exchanged bidirectionally using near field magnetic induction (NFMI) serial ports 604*a-b*. The wireless aspect of the NFMI serial ports 604*a-b* permit programming to be performed without any physical connections to the microprocessor 602. This wireless programming functionality may enhance reliability by removing the dependence of wired connections which may both add cost and wear out over time. Furthermore, the NMFI serial port 604*a* can provide a capability for the firmware of the controller 110 to be upgraded in the field without disassembling the headset 106. Additionally, the NMFI serial port 604*a* can provide a capability for obtaining diagnostic information of the controller 110 while in the field or during manufacturing.

In FIG. 6, the NFMI serial port 604*a* of controller 110 may include a transmit module 605*a* configured to transmit a signal as well as a receive module 606*b* configured to receive a signal using NFMI.

Figure 7:
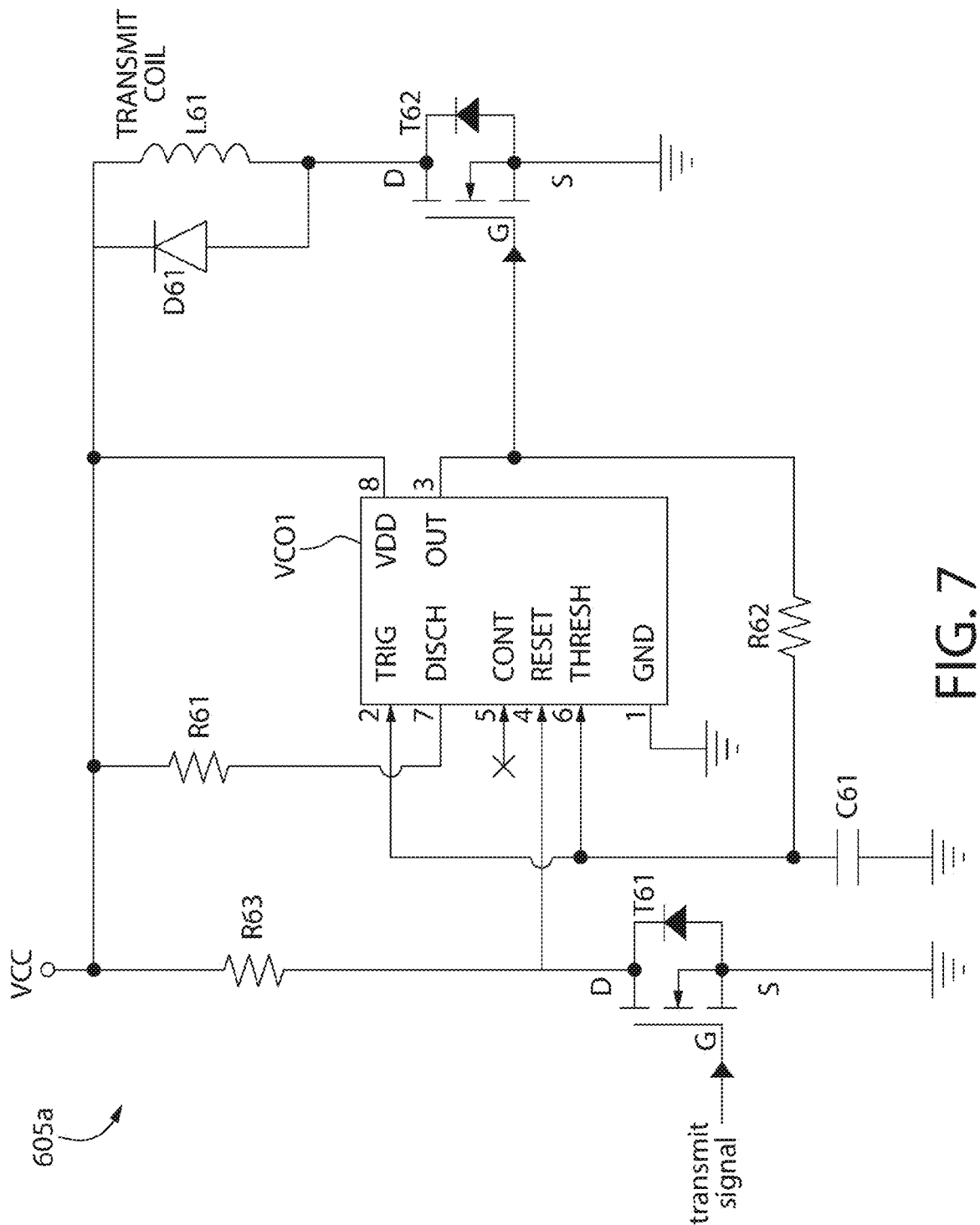
FIG. 7 is a schematic representation of the transmit module of FIG. 6 according to at least one embodiment of the invention.

Referring to FIG. 7, the transmit module 605*a* may include a control transistor T61, a voltage-controlled oscillator module VCO1, a keying transistor T62 and a transmit coil L61.

The control transistor T61 may include a gate terminal configured to receive a transmit signal from an external source (e.g., microprocessor 602). In some embodiments, the transmit signal is a high level representative of a '1' bit or a low level representative of a '0' bit. The control transistor T61 may include a source terminal connected to a ground signal and/or a drain terminal connected to a reset pin 4 (also referred to herein as an input terminal) of the voltage-controlled oscillator module VCO1. In response to receiving a transmit signal having a high level, the control transistor T61 operates in a closed state, whereby the ground signal at the source terminal is connected to the drain terminal, which is connected to the reset pin 4 of the voltage-controlled oscillator module VCO1. In response to receiving a transmit signal having a low level, the control transistor T61 operates in an open state, whereby the power signal VCC is received at reset pin 4 of the voltage-controlled oscillator module VCO1 via pull-up resistor R63.

In response to receiving a low level signal (e.g., ground signal) at reset pin 4, the voltage controlled oscillator module VCO1 outputs a low level signal at out pin 3 (also referred to herein as an output terminal). In response to receiving a high level signal (e.g., VCC signal) at reset pin 4, the voltage controlled oscillator module VCO1 outputs an oscillating signal.

Out pin 3 of the voltage-controlled oscillator module VCO1 is connected to a gate terminal of keying transistor T62. The keying transistor T62 may include a source terminal connected to a ground signal and/or a drain terminal connected to a terminal of the transmit coil L61. In response to receiving a low level signal from voltage controlled oscillator module VCO1, the keying transistor T62 operates in an open state, causing the transmit coil L61 to not receive any current from the VCC signal. Without receiving current, the transmit coil L61 cannot produce a magnetic field (e.g., an electrical signal) that can be received by a receiver coil. The non-detectable electrical signal may be interpreted as a logic level low signal by the receiver coil. In response to receiving an oscillating signal from voltage-controlled oscillator module VCO1, the keying transistor T62 toggles between an open and closed state due to the oscillation of the oscillating signal. If the keying transistor T62 toggles between an open and closed state, the transmit coil may oscillate between being connected and disconnected to ground thereby causing an alternating current to pass through the transmit coil L61. If an alternating current passes through the transmit coil L61, the transmit coil may produce an oscillating magnetic field or signal representative of the oscillating current. The oscillating electrical signal may be interpreted as a logic level high signal by a receiver coil.

In the exemplary configuration of FIG. 7, the transmit module 605*a* can communicate digital data using an on-off keying (OOK) modulation methodology to represent the digital data. OOK represents digital data using the presence or absence of a carrier wave signal, such as the oscillating electrical signal, with the presence of the carrier wave signal representing a logic level high signal and the absence of the carrier wave signal representing a logic level low signal. Digital data may include responses to data requests or status requests, among others.

The transmit module 605a may include a diode D61 connected in parallel with transmit coil L61. In some embodiments, transmit coil L61 may perform a phenomenon known as "inductive fly-back" where transmit coil L61 could render keying transistor T62 inoperable when the transmit coil L61 stops conducting current rapidly. Diode D61 may allow the transmit coil L61 to properly discharge energy and possibly prevent "snap action."

Those skilled in the art may consider that voltage-controlled oscillator module VCO1 can operate at different frequencies by changing components, such as by selecting different combinations of resistors R61, R62 and capacitors C61.

In some embodiments, a capacitor C62 may be positioned between VCC and ground for noise decoupling.

In some embodiments, a resistor R63 is positioned between VCC signal and the reset pin 4 of the voltage-controlled oscillator module VCO1. The resistor R63 provides a resistance between pin 4 and VCC so that ground signal can be received by the voltage-controlled oscillator module VCO1 when the control transistor T61 is in a closed state.

While a voltage-controlled oscillator module VCO1 is shown in FIG. 7 in some embodiments, the voltage controlled oscillator module VCO1 is replaced by another electrical component that performs similar voltage controlled oscillation functionality.

Figure 8A:
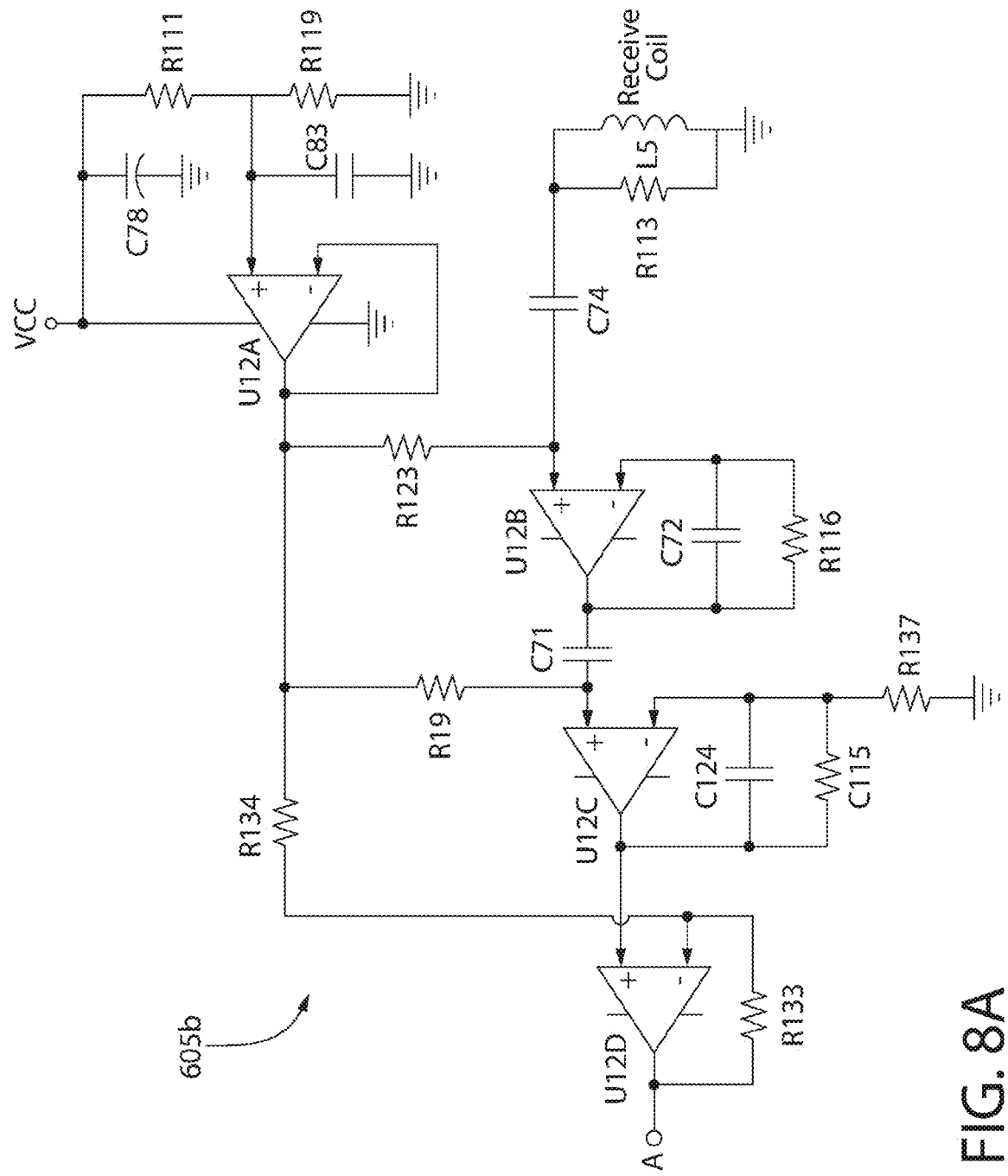
FIGS. 8A-8B are a schematic representation of the receive module of FIG. 6 according to at least one embodiment of the invention.
Figure 8B:
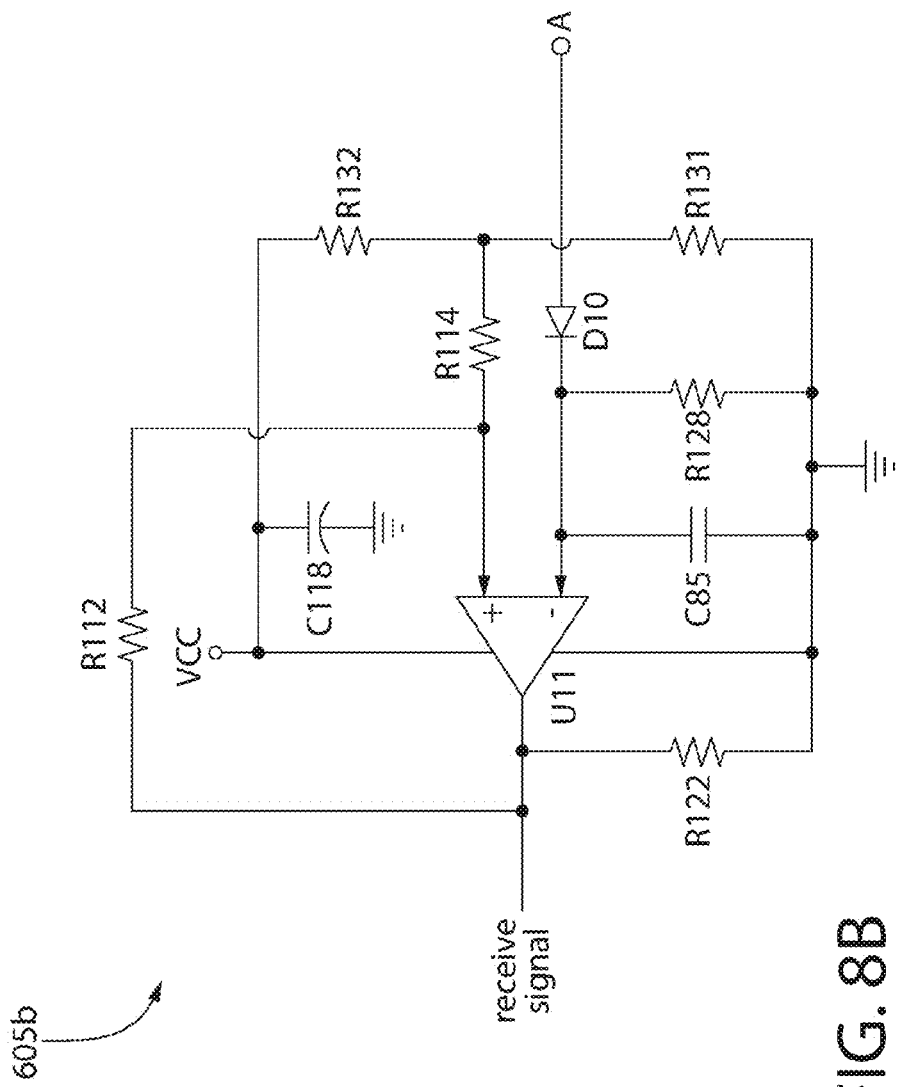

Referring to FIGS. 8A-8B, the receive module 605b may include a receive coil L5, operational amplifiers U12A-D, diode D10 and/or comparator U11.

The receive coil L5 may be configured to receive a wirelessly transmitted magnetic signal from an external source. The wirelessly transmitted magnetic signal may be representative of digital data. Digital data may include programming instructions and data requests for the microprocessor 602, among others.

Operational amplifier U12B may be connected to the receive coil L5 and configured to receive the electrical signal. In some embodiments, resistor R116 and capacitor C72 may be connected to the output terminal and the non-inverting terminal of the operational amplifier U12B. The operational amplifier U12B, optionally in conjunction with resistor R116 and capacitor C72 may operate as a unity gain signal conditioner.

Operational amplifier U12C may be connected to the output terminal of the operational amplifier U12B. In some embodiments, resistors R115, R117 and capacitor C124 may be connected to the output terminal and the non-inverting terminal of the operational amplifier U12C. The operational amplifier U12C optionally in conjunction with resistors R115, R117 and capacitor C124 may amplify the electrical signal. In some embodiments, the operational amplifier U12C may amplify the electrical signal by a gain of approximately 26 dB, along with band pass filtering capabilities to limit DC and high frequency in the electrical signal.

Operational amplifier U12D may be connected to the output terminal of the operational amplifier U12C. In some embodiments, resistor R133 may be connected to the output terminal and the non-inverting terminal of the operational amplifier U12D. The operational amplifier U12D optionally in conjunction with resistor R133 may amplify the electrical signal. In some embodiments, the operational amplifier U12D may amplify the electrical signal by a gain of approximately 14 dB.

Operational amplifier U12A may be connected to one or more input terminals of operational amplifiers U12B-D. The operational amplifier U12A may be configured to bias operational amplifiers U12B-D so the amplified electrical signals are in a range useable for the comparator U11. In some embodiments, resistors R111, R119 may be connected to the non-inverting terminal of operational amplifier U12A. Resistors R111, R119 may be configured to operate as a voltage divider.

Resistors R134, R19 and R123 may each be connected between the output terminal of operational amplifier U12A and an input of one of operational amplifiers U12D, U12C, and U12B, respectively.

Diode D10 may be connected at an anode terminal to the output terminal of operational amplifier U12D. Diode D10 may be configured to rectify the electrical signal output from operational amplifier U12D. In some embodiments, the rectified signal may have a frequency of 200 kHz when representing a logic level high value and a frequency of 0 kHz (i.e. DC) when representing a logic level low value. In some embodiments, resistors R132 and R131 may be connected as a voltage divider between VCC and ground at the anode terminal of the diode D10.

Comparator U11 may be connected to the cathode terminal of diode D10. Comparator U11 may be configured to receive the rectified signal. The R120-C66 network converts the rectified electrical signal to the receive signal transmitted to the microprocessor 602. In some embodiments, resistors R112 and R114 may be connected to the non-inverting terminal of comparator U11. Resistors R112 and R114 may be configured to add hysteresis to the transfer function of the comparator U11. In some embodiments, resistor R120 and capacitor C66 may be connected to the inverting terminal of operational amplifier U11.

Figure 9:
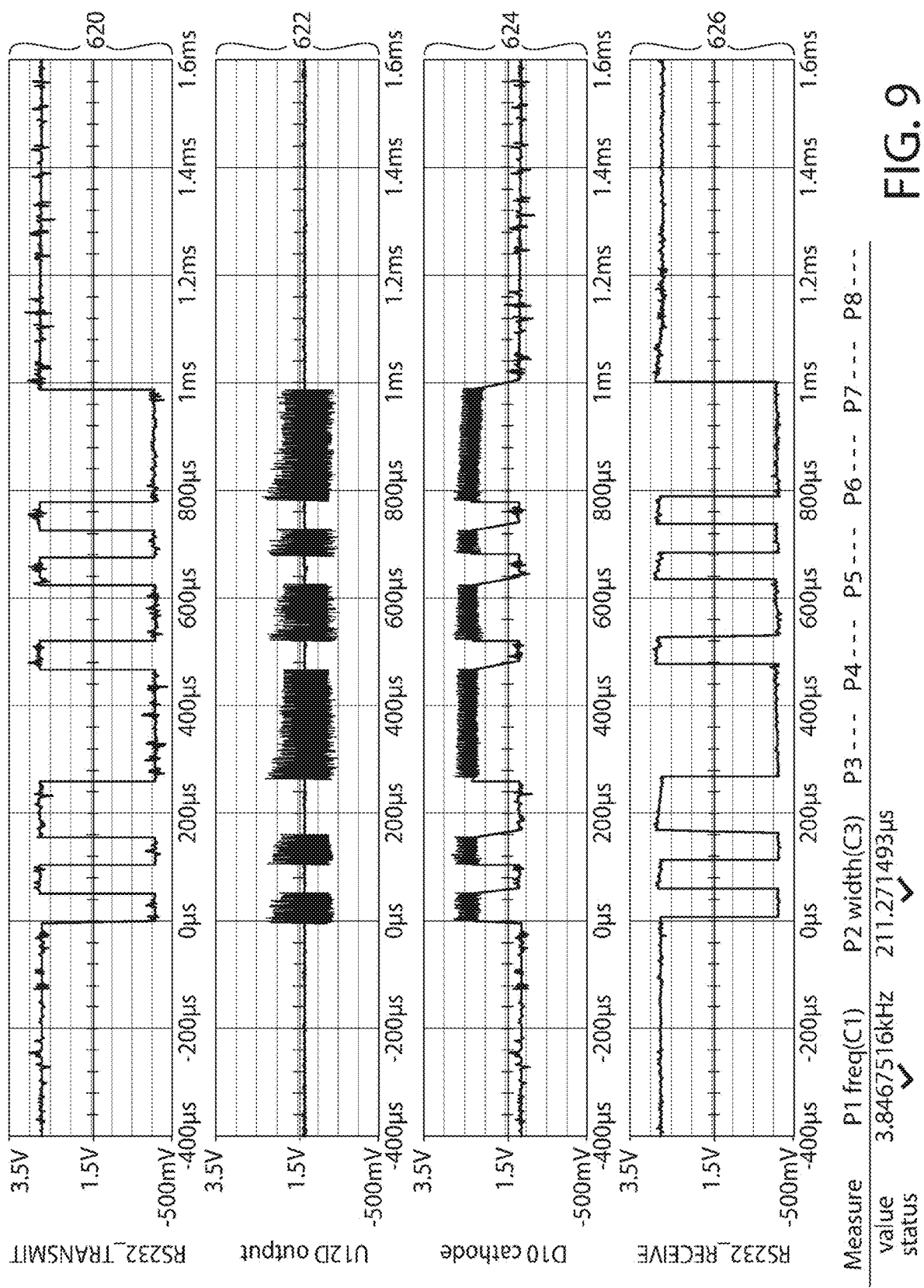
FIG. 9 includes multiple plots representing the electrical signal at a respective output terminal of certain components in the transmit module of FIG. 7 and the receive module of FIGS. 8A-8B, according to at least one embodiment of the invention.

Referring to FIG. 9, graph 620 is a representational plot of the transmission signal in FIG. 7. Graph 622 is a representational plot at the output terminal of operational amplifier U12D in FIGS. 8A-8B. Graph 624 is a representational plot at the cathode terminal of diode D10 in FIG. 8A-8B. Graph 626 is a representational plot at the output of the operational amplifier U11 in FIG. 8A-8B.

In at least one embodiment, there is included one or more computers having one or more processors and memory (e.g., one or more nonvolatile storage devices). In some embodiments, memory or computer readable storage medium of memory stores programs, modules and data structures, or a subset thereof for a processor to control and run the various systems and methods disclosed herein. In one embodiment, a non-transitory computer readable storage medium having stored thereon computer-executable instructions which, when executed by a processor, perform one or more of the methods disclosed herein.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the term "about" may refer to + or −10% of the value referenced. For example, "about 9" is understood to encompass 8.1 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A hear-through limiter, comprising:
   a peak envelope module configured to:
   receive first and second audio signals from first and second audio source terminal devices, respectively, and
   calculate a first peak value of the first audio signal and a second peak value of the second audio signal;
   compare the first peak value of the first audio signal to a previous first peak value of the first audio signal and the second peak value of the second audio signal to a previous second peak value of the second audio signal;
   output either the first peak value of the first audio signal or the previous first peak value and either the second peak value of the second audio signal or the previous second peak value based on whether the first peak value of the first audio signal and the second peak value of the second audio signal are greater than, or less than, the previous first and second peak values;
   a compare module configured to:
   receive the first peak value of the first audio signal and the second peak value of the second audio signal from the peak envelope module;
   compare the first peak value of the first audio signal to the second peak value of the second audio signal, and
   generate a peak comparison signal representative of either the first audio signal or the second audio signal based on whether the first peak value is greater than, or less than, the second peak value; and
   a limiter module configured to:
   selectively attenuate the first and second audio signals responsive to a determination that an amplitude of the peak comparison signal exceeds a predetermined limit threshold, wherein the limiter module does not attenuate the first or second audio signal responsive to a determination that the amplitude of the peak comparison signal is less than the predetermined limit threshold, and
   transmit the attenuated first and second audio signals to first and second audio destination devices, respectively, to produce sound audible to a user.

2. The hear-through limiter of claim 1, further comprising:
   a sidechain filter module configured to:
   limit modulation applied to the first audio signal and the second audio signal to certain frequencies, and
   transmit the first audio signal and the second audio signal as filtered audio signals to a first peak envelope module and a second peak envelope module, respectively.

3. The hear-through limiter of claim 1, further comprising:
   an equalizer module configured to equalize the first audio signal and the second audio signal.

4. The hear-through limiter of claim 1, wherein the first and second audio source terminal devices are ambient sound microphones positioned near ears of the user while the hear-through limiter is operating.

5. The hear-through limiter of claim 1, wherein the first and second audio destination devices are speakers positioned within earcups of a headset wearable by the user.

6. The hear-through limiter of claim 1, wherein the hear-through limiter is positioned within a headset wearable by the user.

7. The hear-through limiter of claim 1, wherein the peak envelope module is configured to calculate the first and second peak values at a predetermined sampling interval.

8. The hear-through limiter of claim 7, wherein the predetermined sampling interval is 32 kHz.

9. The hear-through limiter of claim 1, wherein the peak envelope module is configured to calculate the first peak value or the second peak value based on an exponential decaying peak hold function using a decay coefficient.

10. The hear-through limiter of claim 1, wherein the limiter module is configured to selectively attenuate the first and second audio signals in accordance with an attenuation factor, which is a ratio of the predetermined limit threshold and a magnitude of the peak comparison signal.

11. The hear-through limiter of claim 1, further comprising an equalizer module configured to modify the first and second audio signals or the attenuated first and second audio signals before transmitting the first and second audio signals or the attenuated first and second audio signals to the first and second audio destination devices.

12. The hear-through limiter of claim 11, wherein the equalizer module is configured to modify the first and second audio signals or the attenuated first and second audio signals at certain frequencies using a linear filter.

13. A hear-through limiter, comprising:
a peak envelope module configured to:
   receive first and second audio signals from first and second audio source terminal devices, respectively, and
   calculate a first peak value of the first audio signal and a second peak value of the second audio signal,
   wherein the peak envelope module is configured to calculate the first peak value or the second peak value based on an exponential decaying peak hold function using a decay coefficient;
a compare module configured to:
   compare the first peak value of the first audio signal to the second peak value of the second audio signal, and
   generate a peak comparison signal representative of either the first audio signal or the second audio signal based on whether the first peak value is greater than, or less than, the second peak value; and
a limiter module configured to:
   selectively attenuate the first and second audio signals to obtain attenuated first and second audio signals, based on whether the peak comparison signal exceeds a predetermined limit threshold and in accordance with an attenuation factor, wherein the attenuation factor is a ratio of the predetermined limit threshold and a magnitude of the peak comparison signal, and
   transmit the attenuated first and second audio signals to first and second audio destination devices, respectively, to produce sound audible to a user.

14. A hear-through limiter, comprising:
a peak envelope module configured to:
   receive first and second audio signals from first and second audio source terminal devices, respectively,
   calculate a first peak value of the first audio signal and a second peak value of the second audio signal, and
   calculate the first peak value or the second peak value based on an exponential decaying peak hold function using a decay coefficient;
a compare module configured to:
   compare the first peak value of the first audio signal to the second peak value of the second audio signal, and
   generate a peak comparison signal representative of either the first audio signal or the second audio signal based on whether the first peak value is greater than, or less than, the second peak value;
a limiter module configured to:
   selectively attenuate the first and second audio signals to obtain attenuated first and second audio signals, based on whether the peak comparison signal exceeds a predetermined limit threshold, and
   transmit the attenuated first and second audio signals to first and second audio destination devices, respectively, to produce sound audible to a user; and
an equalizer module configured to modify the first and second audio signals or the attenuated first and second audio signals before the first and second audio signals or the attenuated first and second audio signals are transmitted to the first and second audio destination devices.

* * * * *